United States Patent
Tonkikh

(10) Patent No.: US 12,543,411 B2
(45) Date of Patent: Feb. 3, 2026

(54) OPTOELECTRONIC DEVICE WITH MULTIPLE EPITAXIAL LAYERS, AND PRODUCTION METHOD

(71) Applicant: OSRAM Opto Semiconductors GmbH, Regensburg (DE)

(72) Inventor: Alexander Tonkikh, Wenzenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 646 days.

(21) Appl. No.: 17/784,855

(22) PCT Filed: Dec. 9, 2020

(86) PCT No.: PCT/EP2020/085194
§ 371 (c)(1),
(2) Date: Jun. 13, 2022

(87) PCT Pub. No.: WO2021/116144
PCT Pub. Date: Jun. 17, 2021

(65) Prior Publication Data
US 2023/0028464 A1 Jan. 26, 2023

(30) Foreign Application Priority Data
Dec. 12, 2019 (DE) .......................... 102019134216.3

(51) Int. Cl.
*H10H 20/821* (2025.01)
*H10H 20/01* (2025.01)
*H10H 20/812* (2025.01)

(52) U.S. Cl.
CPC .......... *H10H 20/821* (2025.01); *H10H 20/01* (2025.01); *H10H 20/812* (2025.01)

(58) Field of Classification Search
CPC ....... H01L 33/20; H01L 33/24; H10H 20/819; H10H 20/821; H10H 20/01; H10H 20/812;
(Continued)

(56) References Cited

U.S. PATENT DOCUMENTS

| | | | |
|---|---|---|---|
| 5,398,255 A | 3/1995 | Terakado | |
| 10,193,013 B2* | 1/2019 | Bour | .................. H10H 20/8162 |

(Continued)

FOREIGN PATENT DOCUMENTS

| | | |
|---|---|---|
| CN | 110521010 A | 11/2019 |
| EP | 0314372 A2 | 5/1989 |
| WO | 2005034252 A2 | 4/2005 |

*Primary Examiner* — Julio J Maldonado
*Assistant Examiner* — Paul A Berry
(74) *Attorney, Agent, or Firm* — Slater Matsil, LLP

(57) ABSTRACT

In an embodiment an optoelectronic device includes an epitaxial layer stack having at least a first epitaxial layer and a second epitaxial layer arranged above the first epitaxial layer, wherein the following layers are embedded in the epitaxial layer stack a first semiconductor layer of a first conductivity type, an active layer arranged above the first semiconductor layer and configured to generate light, and a second semiconductor layer of a second conductivity type arranged above the active layer, wherein an interface between the first epitaxial layer and the second epitaxial layer extends at least partially through the first semiconductor layer and/or the second semiconductor layer, and wherein the active layer is embedded in a non-doped barrier layer, the barrier layer covering one or more side surfaces of the active layer.

15 Claims, 3 Drawing Sheets

(58) Field of Classification Search
CPC .... H10H 20/013; H10H 29/10; H10H 20/872; H10H 20/062; H10H 20/011–813; H10H 20/81; H10H 20/8162; H10H 20/017; H01S 5/1053; H01S 5/1064

See application file for complete search history.

(56) References Cited

U.S. PATENT DOCUMENTS

| | | |
|---|---|---|
| 11,870,011 B2 | 1/2024 | Meng |
| 2003/0173571 A1* | 9/2003 | Kish, Jr. ............... H10F 30/222 |
| | | 257/85 |
| 2006/0043408 A1 | 3/2006 | Hashimoto et al. |
| 2007/0210315 A1 | 9/2007 | Masselink et al. |
| 2008/0122341 A1 | 5/2008 | Orita et al. |
| 2017/0170360 A1 | 6/2017 | Bour et al. |

* cited by examiner

OPTOELECTRONIC DEVICE WITH MULTIPLE EPITAXIAL LAYERS, AND PRODUCTION METHOD

This patent application is a national phase filing under section 371 of PCT/EP2020/085194, filed Dec. 9, 2020, which claims the priority of German patent application 10 2019 134 216.3, filed Dec. 12, 2019, each of which is incorporated herein by reference in its entirety.

TECHNICAL FIELD

The present invention relates to an optoelectronic device having a plurality of epitaxial layers and a method for manufacturing such an optoelectronic device.

BACKGROUND

For many applications of LEDs (light emitting diodes), miniaturization of the LEDs is required. However, miniaturization often leads to efficiency losses, especially in the red spectral range.

SUMMARY

Embodiments provide an optoelectronic device that exhibits high efficiency even in a design with small dimensions. Further embodiments provide a method for manufacturing the optoelectronic device.

An optoelectronic device according to a first embodiment of the present application comprises an epitaxial layer stack comprising at least a first epitaxial layer and a second epitaxial layer arranged above the first epitaxial layer. The epitaxial layer stack may in particular comprise further epitaxial layers. The epitaxial layers of the epitaxial layer stack are epitaxially grown layers, in particular semiconductor layers. Between epitaxial layers lying one on top of the other there is in each case an interface or boundary. In particular, the second epitaxial layer is grown directly on the first epitaxial layer, i.e., there is no intermediate layer between the first epitaxial layer and the second epitaxial layer.

A first semiconductor layer, a second semiconductor layer, and an active layer are embedded in the epitaxial layer stack and, in particular, in the first epitaxial layer and the second epitaxial layer.

The first semiconductor layer is thereby of a first conductivity type, and the second semiconductor layer is of a second conductivity type. The second conductivity type is opposite to the first conductivity type.

The different conductivity types can be created by doping, i.e. by introducing impurity atoms into the semiconductor material. One of the two conductivity types can be an n-type conductivity and the other conductivity type can be a p-type conductivity. Consequently, either the first semiconductor layer is n-doped and the second semiconductor layer is p-doped, or the first semiconductor layer is p-doped and the second semiconductor layer is n-doped.

The active layer is arranged above the first semiconductor layer and is configured to generate light. The second semiconductor layer is arranged above the active layer. Consequently, the active layer is arranged between the first semiconductor layer and the second semiconductor layer.

An interface between the first epitaxial layer and the second epitaxial layer or between other epitaxial layers of the epitaxial layer stack extends at least partially through the first semiconductor layer and/or the second semiconductor layer. Accordingly, the interface or boundary between the first and second epitaxial layers is located at least partially outside the p-n junction space charge region. Defects formed at the interface are not occupied by charge carriers, i.e., electrons and holes, during operation of the optoelectronic device, thereby preventing non-radiative recombination of charge carriers across such states and increasing the efficiency of the optoelectronic device even at small lateral dimensions.

The optoelectronic device may be a semiconductor chip manufactured in a semiconductor wafer and separated from the wafer, for example, by sawing. In particular, the optoelectronic device may form a pixel or a subpixel of an optoelectronic application.

Furthermore, the optoelectronic device can be used, for example, as a light-emitting diode (LED), as a superluminescent light-emitting diode (SLED or SLD), as a laser diode (LD), as a vertical-cavity surface-emitting laser (VCSEL), as a resonant-tunnelling diode (RTD), as a bipolar transistor with heterojunction, as a bipolar transistor with heterojunction, or as a bipolar transistor with heterojunction: vertical-cavity surface-emitting laser; short: VCSEL), as resonant-tunnelling diode (RTD), as heterojunction bipolar transistor (HBT) or as high-electron-mobility transistor (HEMT).

According to one embodiment, the optoelectronic device is a µLED, i.e. micro-LED. A µLED has small lateral extensions, in particular in the µm range.

For example, InGaAlP, InAlGaN or AlGaAs materials can be used as epitaxial materials for the first and second epitaxial layers.

In a particular way, embodiments of the invention can be used for optoelectronic devices that require an additional artificial interface between two epitaxial layers due to technological requirements.

The light emitted by the optoelectronic device can be, for example, light in the visible range, ultraviolet (UV) light, and/or infrared (IR) light.

In particular, the device can emit red light and be, for example, a red light emitting µLED.

For example, the optoelectronic device can be used in augmented reality or mixed reality applications. Furthermore, the optoelectronic device can be used in pixelated arrays or pixelated light sources.

It may be provided that all portions of the interface between the first epitaxial layer and the second epitaxial layer which extend parallel to a main surface of the active layer do not extend through the active layer and, in particular, do not extend through the undoped barrier layer described further below in which the active layer is embedded. In particular, this may also apply to further interfaces between superimposed epitaxial layers of the epitaxial layer stack. In other words, it may be provided that all portions of the interface layers between two superimposed epitaxial layers of the epitaxial layer stack which extend parallel to a main surface of the active layer do not extend through the active layer and, in particular, do not extend through the barrier layer.

A first portion of the interface between the first epitaxial layer and the second epitaxial layer may extend through the first semiconductor layer, and a second portion of the interface may extend through the second semiconductor layer. The first and second portions may be laterally offset from each other and, in particular, spaced apart from each other. Laterally offset means that they are offset from each other in a direction parallel to a main surface of the active layer.

Furthermore, the first portion of the interface may be arranged outside an outline of the active layer, whereas the second portion of the interface is arranged within an outline of the active layer. The outline of the active layer indicates the lateral extent of the active layer. In other words, the first portion of the interface is arranged laterally at a distance from the active layer, while the second portion is arranged directly above or below the active layer.

The first portion and/or the second portion of the interface may be parallel to a main surface of the active layer. The interface may further comprise one or more further portions. For example, a further portion of the interface may connect the first and second portions.

More generally, at least a portion of the interface between the first epitaxial layer and the second epitaxial layer may extend parallel to a main surface of the active layer and may further extend above or below the main surface of the active layer.

The active layer may comprise one or more side surfaces connecting the two main surfaces of the active layer. At least a portion of the interface between the first and second epitaxial layers may extend along at least one of the side surfaces of the active layer.

The active layer may comprise a mesa structure, meaning that the one or more side surfaces do not form a 90° angle with the main surfaces. For example, the active layer may taper upward, meaning that the cross-section of the active layer decreases upward. Consequently, at least one side surface of the active layer forms an angle with the lower main surface of less than 90°. A portion of the interface between the first and second epitaxial layers may extend along this side surface.

The active layer may be embedded in a non-doped barrier layer. The barrier layer can cover the main surfaces and one or more side surfaces of the active layer. The barrier layer is arranged above the first semiconductor layer. The second semiconductor layer is arranged above the barrier layer.

Furthermore, the first semiconductor layer can be arranged on a substrate, in particular a semiconductor substrate. The semiconductor substrate can be part of the first epitaxial layer.

A method according to a second embodiment of the application is for manufacturing an optoelectronic device. The method provides that an epitaxial layer stack is generated from at least a first epitaxial layer and a second epitaxial layer arranged above the first epitaxial layer. Further, the epitaxial layer stack may comprise additional epitaxial layers. Embedded in the epitaxial layer stack, and in particular in the first and second epitaxial layers, are: a first semiconductor layer of a first conductivity type, an active layer arranged above the first semiconductor layer and configured to generate light, and a second semiconductor layer of a second conductivity type arranged above the active layer. An interface between the first epitaxial layer and the second epitaxial layer extends at least partially through the first semiconductor layer and/or the second semiconductor layer.

After growing the first epitaxial layer, the first epitaxial layer can be structured, giving it a three-dimensional surface. The second epitaxial layer is grown on this surface.

By structuring the first epitaxial layer, the active layer in particular is structured.

The second epitaxial layer can be generated directly on the first epitaxial layer.

The method according to the second embodiment may comprise the above-described embodiments of the optoelectronic device according to the first embodiment.

BRIEF DESCRIPTION OF THE DRAWINGS

In the following, embodiments of the invention are explained in more detail with reference to the accompanying drawings. In these.

DETAILED DESCRIPTION OF ILLUSTRATIVE EMBODIMENTS

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

Figure 1A:
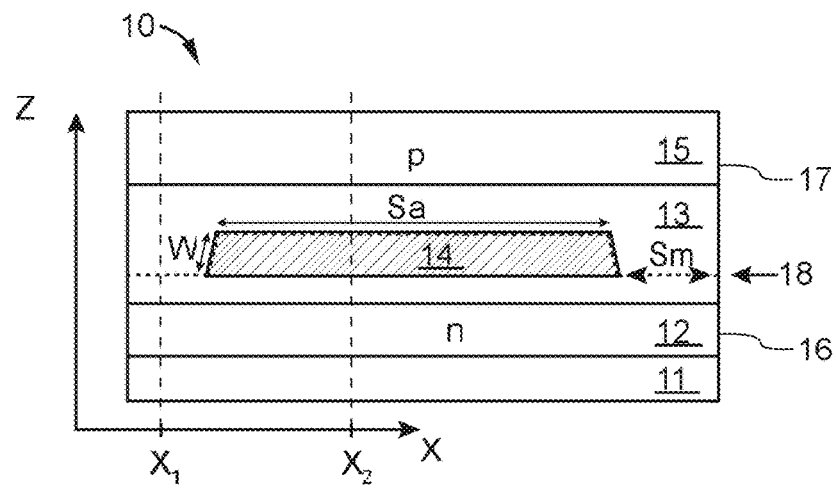
FIG. 1A shows an illustration of an embodiment of an optoelectronic device not according to the invention.

FIG. 1A shows a schematic structure of an optoelectronic device designed as a µLED 10 in a cross section in an x-z plane according to an embodiment not according to the invention.

The µLED 10 is made of an InGaAlP compound, for example, and emits red light. The µLED 10 contains a substrate 11 on which an n-doped first semiconductor layer 12 is deposited. An undoped barrier layer 13 is deposited on the first semiconductor layer 12, in which an active layer 14 is integrated. The active layer 14 has a direct band gap that is lower than the surrounding barriers from the barrier layer 13. A p-doped second semiconductor layer 15 is deposited on the barrier layer 13.

The µLED 10 further comprises a stack of multiple epitaxial layers. In the present embodiment, the stack comprises a first epitaxial layer 16 and a second epitaxial layer 17 arranged above the first epitaxial layer 16. Embedded in the two epitaxial layers 16 and 17, as shown in FIG. 1A, are the substrate 11, the n-doped first semiconductor layer 12, the undoped barrier layer 13, the active layer 14, and the p-doped second epitaxial layer 15. An interface 18 extends between the first epitaxial layer 16 and the second epitaxial layer 17, which is shown in FIG. 1A by an arrow and a dotted line. The interface 18 extends substantially through the undoped barrier layer 13 and extends along the top surface of the active layer 14.

Furthermore, in FIG. 1A, the width of the upper main surface of the active layer 14 in the x-z plane shown is denoted by Sa. W denotes the vertical extent of the active layer 14 and Sm denotes the lateral width of the interface 18 adjacent to the active layer 14.

Figure 1B:
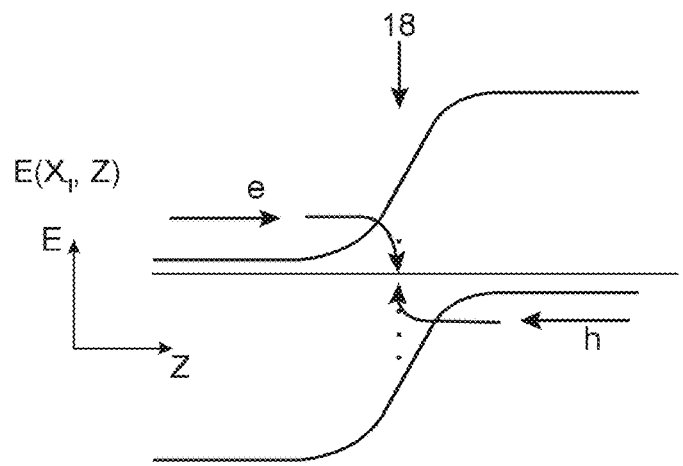
FIGS. 1B and 1C shows illustrations of the band structure of the optoelectronic device of FIG. 1A at various locations.
Figure 1C:
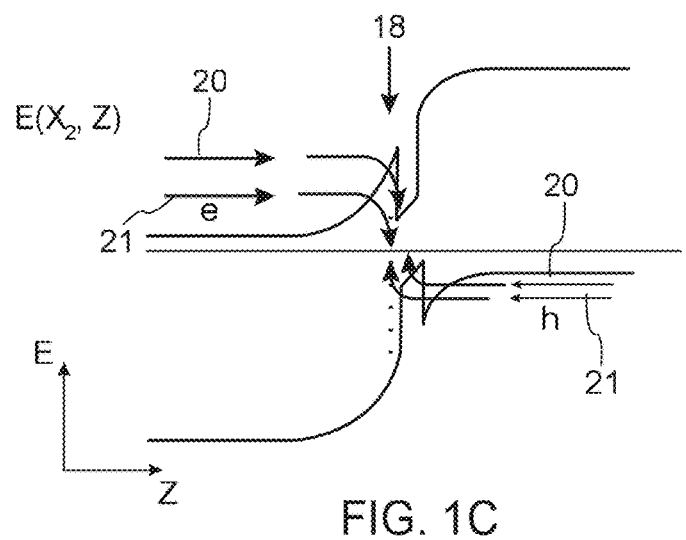

In FIGS. 1B and 1C, the band structure of μLED 10 is shown at the location $x_1$ and $x_2$, respectively, shown in FIG. 1A. That is, FIG. 1B shows the band structure of the μLED 10 in an area outside the active layer 14, while FIG. 1C shows the band structure in an area that extends through the active layer 14. In each of FIGS. 1B and 1C, the energy is plotted versus the z coordinate at the location $x_1$ and $x_2$, respectively. The path of the interface 18 is shown by an arrow and dotted line in FIGS. 1B and 1C, as in FIG. 1A. Further, arrows illustrate the flow of electrons ("e") and holes ("h") during low current operation of μLED 10.

In FIG. 1B, the interface 18 is located within the p-n junction space charge region. At location $x_1$, electrons and holes recombine non-radiatively via states at interface 18. This recombination competes with radiative recombination in active layer 14.

FIG. 1C shows that also at the location $x_2$ the interface 18 is within the p-n junction. The band gap is reduced in the region of the active layer 14. In this region, radiative recombination of the charge carriers occurs, as indicated by arrows 20. However, there is also a path of charge carriers along the interface 18, as indicated by arrows 21, which leads to non-radiative recombination of the charge carriers.

The non-radiative recombination of charge carriers described above significantly reduces the efficiency of the red light emitting μLED 10.

Figure 2A:
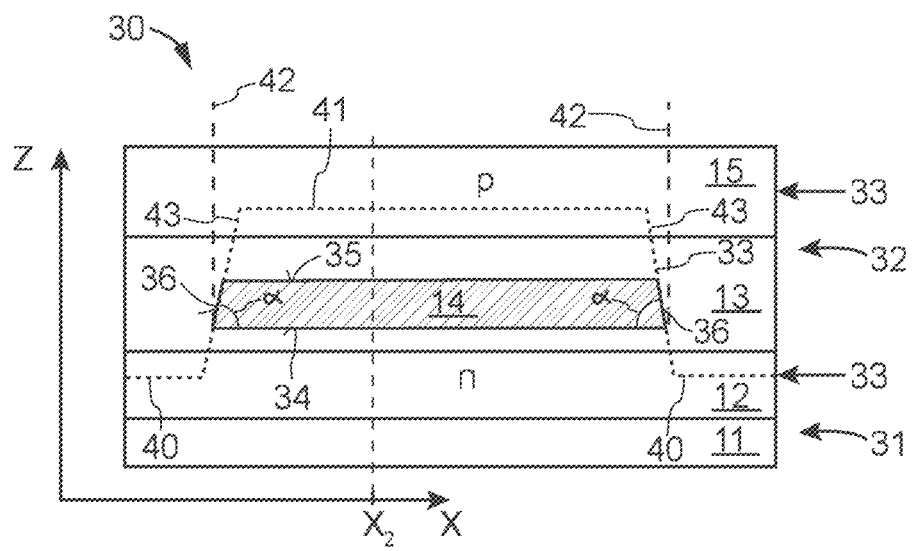
FIG. 2A shows an illustration of an embodiment of an optoelectronic device according to the invention.

FIG. 2A shows a schematic structure of an optoelectronic device designed as μLED 30 in a section in an x-z plane according to an embodiment according to the invention.

The μLED 30 has a first epitaxial layer 31 and a second epitaxial layer 32 arranged above the first epitaxial layer 31. To manufacture the μLED 30, the first epitaxial layer 31 is grown first. This is then structured, in particular by etching, to give it a three-dimensional structure on its upper side. The second epitaxial layer 32 is then grown directly on the structured first epitaxial layer 31. An interface 33 between the first epitaxial layer 31 and the second epitaxial layer 32 is indicated in FIG. 2A by a dotted line and additionally by arrows.

A substrate 11, an n-doped first semiconductor layer 12, an undoped barrier layer 13, an active layer 14 with a direct band gap, and a p-doped second semiconductor layer 15 are embedded or integrated in the first epitaxial layer 31 and the second epitaxial layer 32 in the same way as in the μLED 10 of FIG. 1A.

The n-doped first semiconductor layer 12 and the p-doped second semiconductor layer 15 each include contacting and rewiring layers.

The active layer 14 comprises a lower main surface 34, an upper main surface 35 opposite the lower main surface 34, and side surfaces 36. The side surfaces 36 each form an angle α with the lower main surface 34 that is smaller than 90°.

The interface 33 between the first epitaxial layer 31 and the second epitaxial layer 32 comprises a first portion 40 and a second portion 41. The first portion 40 of the interface 33 extends within the n-doped first semiconductor layer 12 and parallel to the main surfaces 34, 35 of the active layer 14.

Further, the first portion 40 of the interface 33 extends outside an outline 42 of the active layer 14, indicated by dashed lines in FIG. 2A. The outline 42 indicates the lateral extent, i.e. the extent in the x-direction, of the active layer 14.

The second portion 41 of the interface 33 extends within the p-doped second semiconductor layer 15 and parallel to the main surfaces 34, 35 of the active layer 14. Further, the second portion 41 extends within the outline 42 of the active layer 14 and thus directly above the active layer 14.

In other words, this means that the second portion 41 of the interface 33 located at the level of the active layer 14 is located in the p-doped second semiconductor layer 15, while the first portion 40 of the interface 33 located outside the active layer 14 is located in the n-doped first semiconductor layer 12. Consequently, both portions 41 and 42 of the interface 33 are located outside the p-n junction.

Further, the interface 33 has one or more lateral portions 43 connecting the first portion 40 to the second portion 41. The lateral portions 43 extend along the side surfaces 36 of the active layer 36 and, in particular, have the same inclination as the side surfaces 36.

Figure 2B:
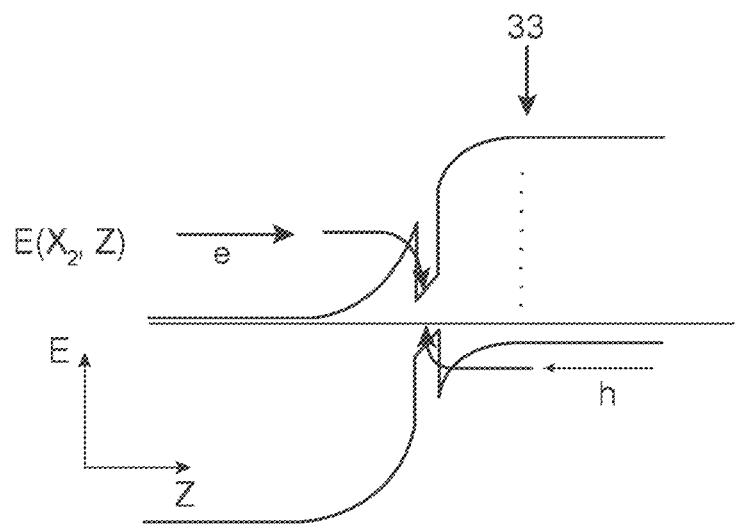
FIG. 2B shows an illustration of the band structure of the optoelectronic device of FIG. 2A at one location.

In FIG. 2B, the band structure of μLED 30 is shown at the location $x_2$, shown in FIG. 2A, which is at the level of the active layer 14. In FIG. 2B, the energy is plotted versus the z-coordinate at the location $x_2$. The portion of the interface 33 is shown by an arrow and a dotted line. Further, arrows illustrate the flow of electrons ("e") and holes ("h") during low power operation of μLED 30.

Since the interface 33 is outside the p-n junction, only radiative recombination of charge carriers takes place in FIG. 2B, which significantly increases the efficiency of the μLED 30 compared to the μLED 10 of FIG. 1A.

The non-radiative recombination of charge carriers via intermediate states outside the active layer 33, as shown in FIG. 1B, also occurs in μLED 30. However, in low current operation, the population of charge carriers in the active layer 14 is an exponential function of the applied voltage. Therefore, significantly more radiative recombination of charge carriers occurs in the region of the active layer 14, increasing efficiency by, for example, more than an order of magnitude compared to μLED 10.

By structuring the first epitaxial layer 31, the active layer 14 is also structured, allowing charge carriers to recombine non-radiatively via states at the interface 33 in the region of the side surfaces 36 of the active layer 14 during operation of the μLED 30. However, for a typical vertical extent W of the active layer 14 of 5 nm to 100 nm and a lateral extent of the μLED 30 of 1 μm to 100 μm, the ratio of the width of the upper main surface 35 of the active layer 14 to the portion of the interface 33 at the side surfaces 36 of the active layer 14 is at least 10. For example, μLEDs suitable for augmented or mixed reality applications have a lateral extent of 1 μm to 5 μm and a vertical extent W of the active layer 14 of 5 nm to 50 nm. Therefore, for these μLEDs, the ratio of the width of the upper main surface 35 of the active layer 14 to the portion of the interface 33 at the side surfaces 36 of the active layer 14 is at least 20.

Figure 3A:
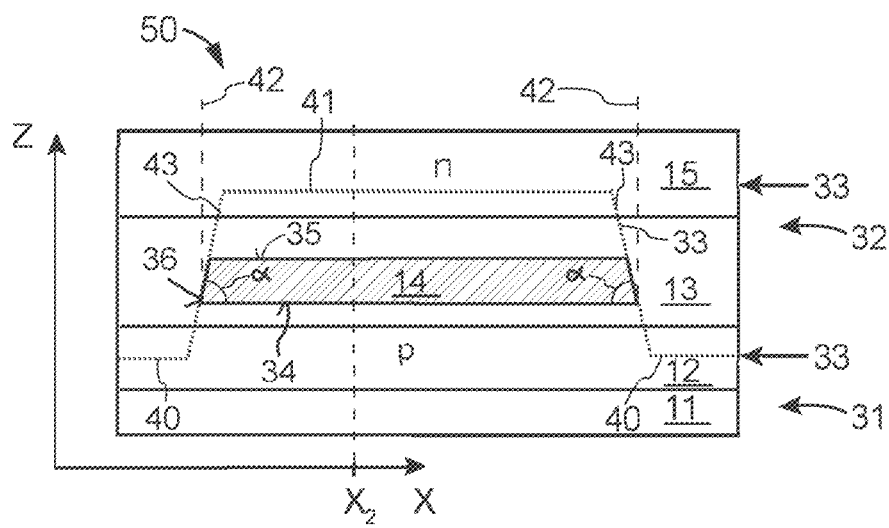
FIG. 3A shows an illustration of a further embodiment of an optoelectronic device according to the invention.

FIG. 3A shows a schematic structure of an optoelectronic device designed as μLED 50 in a section in an x-z plane according to a further embodiment according to the invention.

The μLED 50 shown in FIG. 3A is largely identical to the μLED 30 of FIG. 2A. The difference is that in the μLED 50 the first semiconductor layer 12 below the active layer 14 is p-doped, while the second semiconductor layer 15 above the active layer 14 is n-doped.

Consequently, the second portion 41 of the interface 33 located at the level of the active layer 14 is in the n-doped second semiconductor layer 15, while the first portion 40 of the interface 33 located outside the active layer 14 is in the p-doped first semiconductor layer 12.

Figure 3B:
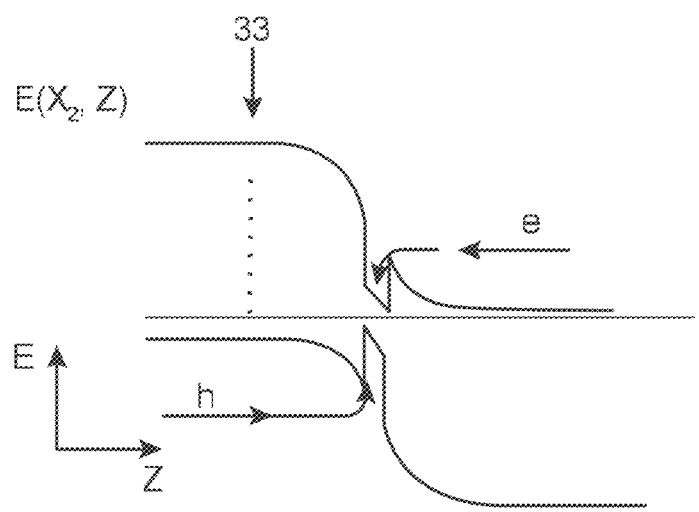
FIG. 3B shows an illustration of the band structure of the optoelectronic device of FIG. 3A at one location.

This also changes the band structure of the μLED 50, which is shown in FIG. 3B at the location $x_2$, shown in FIG.

3A, which is at the level of the active layer 14. In FIG. 3B, the energy is plotted versus the z-coordinate at the location $x_2$. The path of the interface 33 is shown by an arrow and a dotted line. Since the interface 33 extends outside the p-n junction, essentially only radiative recombination of charge carriers occurs in FIG. 3B.

The invention claimed is:

1. An optoelectronic device comprising:
an epitaxial layer stack comprising at least a first epitaxial layer and a second epitaxial layer arranged above the first epitaxial layer, wherein the following layers are embedded in the epitaxial layer stack:
  a first semiconductor layer of a first conductivity type,
  an active layer arranged above the first semiconductor layer and configured to generate light, wherein the active layer comprises a first main surface and a second main surface opposite the first main surface, and wherein the first main surface and the second main surface are connected by one or more side surfaces of the active layer, and
  a second semiconductor layer of a second conductivity type arranged above the active layer,
  wherein an interface between the first epitaxial layer and the second epitaxial layer extends at least partially through the first semiconductor layer and/or the second semiconductor layer, and
  wherein the active layer is embedded in a non-doped barrier layer, the barrier layer covering the first and second main surfaces and the one or more side surfaces of the active layer.

2. The optoelectronic device according to claim 1, wherein a first portion of the interface between the first epitaxial layer and the second epitaxial layer extends through the first semiconductor layer and a second portion of the interface between the first epitaxial layer and the second epitaxial layer extends through the second semiconductor layer.

3. The optoelectronic device according to claim 2, wherein the first portion of the interface is arranged outside an outline of the active layer and the second portion of the interface lies within the outline of the active layer.

4. The optoelectronic device according to claim 2, wherein the first portion and/or the second portion of the interface are parallel to a main surface of the active layer.

5. The optoelectronic device according to claim 1, wherein at least a portion of the interface between the first epitaxial layer and the second epitaxial layer is parallel to a main surface of the active layer and above or below the main surface of the active layer.

6. The optoelectronic device according to claim 1, wherein the active layer comprises one or more side surfaces and at least a portion of the interface between the first epitaxial layer and the second epitaxial layer extends along at least one of the side surfaces of the active layer.

7. The optoelectronic device according to claim 1, wherein the active layer comprises a mesa structure.

8. The optoelectronic device according to claim 1, wherein a ratio of a width of an upper main surface of the active layer to a portion of the interface extending along at least one of the side surfaces of the active layer is at least 10.

9. The optoelectronic device according to claim 1, wherein one of the first and second conductivity types is a p-type conductivity type and the other conductivity type is an n-type conductivity type.

10. The optoelectronic device according to claim 1, wherein the optoelectronic device is a μLED.

11. The optoelectronic device according to claim 1, wherein the first semiconductor layer is arranged on a substrate.

12. A method for manufacturing the optoelectronic device according to claim 1, the method comprising:
generating the epitaxial layer stack of at least the first epitaxial layer and the second epitaxial layer arranged above the first epitaxial layer.

13. The method according to claim 12, wherein, after the first epitaxial layer is generated, the first epitaxial layer is structured and the second epitaxial layer is generated on the structured first epitaxial layer.

14. The method according to claim 13, wherein structuring the first epitaxial layer structures the active layer.

15. The method according to claim 12, wherein the second epitaxial layer is generated directly on the first epitaxial layer.

* * * * *